(12) United States Patent
Takeichi

(10) Patent No.: US 11,552,227 B2
(45) Date of Patent: Jan. 10, 2023

(54) METHOD OF MANUFACTURING LIGHT EMITTING DEVICE, AND LIGHT EMITTING DEVICE

(71) Applicant: NICHIA CORPORATION, Anan (JP)

(72) Inventor: Junji Takeichi, Anan (JP)

(73) Assignee: NICHIA CORPORATION, Anan (JP)

( * ) Notice: Subject to any disclaimer, the term of this patent is extended or adjusted under 35 U.S.C. 154(b) by 182 days.

(21) Appl. No.: 17/091,971

(22) Filed: Nov. 6, 2020

(65) Prior Publication Data
US 2021/0057619 A1  Feb. 25, 2021

Related U.S. Application Data

(63) Continuation of application No. 16/391,072, filed on Apr. 22, 2019, now Pat. No. 10,862,012.

(30) Foreign Application Priority Data

Apr. 25, 2018  (JP) ............................. JP2018-083917

(51) Int. Cl.
*H01L 33/54* (2010.01)
*H01L 33/60* (2010.01)
*H01L 33/62* (2010.01)
*H01L 25/075* (2006.01)

(52) U.S. Cl.
CPC .......... *H01L 33/54* (2013.01); *H01L 25/0753* (2013.01); *H01L 33/60* (2013.01);
(Continued)

(58) Field of Classification Search
CPC ..... H01L 33/54; H01L 25/0753; H01L 33/60; H01L 33/62; H01L 2933/005; H01L 2933/0058; H01L 2933/0066
See application file for complete search history.

(56) References Cited

U.S. PATENT DOCUMENTS 6,399,425 B1  6/2002  Brand et al.
7,154,185 B2  12/2006  Lee et al.
(Continued)

FOREIGN PATENT DOCUMENTS

JP  2006-108363 A  4/2006
JP  2007-005483 A  1/2007
(Continued)

OTHER PUBLICATIONS

Non-Final Office Action in the related U.S. Appl. No. 16/391,072 dated Apr. 16, 2020.
(Continued)

*Primary Examiner* — Karen Kusumakar
*Assistant Examiner* — Adam S Bowen
(74) *Attorney, Agent, or Firm* — Global IP Counselors, LLP

(57) ABSTRACT

A method of manufacturing a light emitting device includes: providing a wiring substrate on which a light emitting element and a frame body surrounding the light emitting element are disposed; forming a support column member in contact with at least one of an inner peripheral surface and a top surface of a corresponding portion of the frame body, an outermost edge of the support column member being positioned at a same position or inwardly of an outermost edge of the frame body in a top plan view; and forming a light-transmissive member at least partially in contact with the frame body and the support column member with at least a part of the light-transmissive member being positioned above the frame body and the support column member.

20 Claims, 3 Drawing Sheets

(52) U.S. Cl.
CPC ........ *H01L 33/62* (2013.01); *H01L 2933/005* (2013.01); *H01L 2933/0058* (2013.01); *H01L 2933/0066* (2013.01)

(56) References Cited

U.S. PATENT DOCUMENTS

| | | | |
|---|---|---|---|
| 2006/0170332 A1 | 8/2006 | Tamaki et al. | |
| 2006/0291246 A1 | 12/2006 | Hattori et al. | |
| 2009/0141492 A1 | 6/2009 | Fujino et al. | |
| 2011/0180832 A1 | 7/2011 | Kim | |
| 2012/0326193 A1 | 12/2012 | Park et al. | |
| 2014/0124812 A1* | 5/2014 | Kuramoto | H01L 33/52 438/27 |
| 2016/0149104 A1* | 5/2016 | Bergmann | H01L 33/62 257/676 |

FOREIGN PATENT DOCUMENTS

| | | |
|---|---|---|
| JP | 2007-201171 A | 8/2007 |
| JP | 2011-159970 A | 8/2011 |
| JP | 2013-008941 A | 1/2013 |
| JP | 2013-207230 A | 10/2013 |
| JP | 2015-012104 A | 1/2015 |
| JP | 2015-015405 A | 1/2015 |
| JP | 2017-204502 A | 11/2017 |
| WO | 2012157644 A1 | 11/2012 |

OTHER PUBLICATIONS

Notice of Allowance in the related U.S. Appl. No. 16/391,072 dated Aug. 11, 2020.

\* cited by examiner

METHOD OF MANUFACTURING LIGHT EMITTING DEVICE, AND LIGHT EMITTING DEVICE

CROSS-REFERENCE TO RELATED APPLICATION

This is a continuation application of U.S. patent application Ser. No. 16/391,072 filed on Apr. 22, 2019. This application claims priority to Japanese Patent Application No. 2018-083917, filed on Apr. 25, 2018. The entire disclosures of U.S. patent Ser. No. 16/391,072 and Japanese Patent Application No. 2018-083917 are hereby incorporated herein by reference.

BACKGROUND

The present disclosure relates to a method of manufacturing a light emitting device, and a light emitting device.

Potting of a light-transmissive material that forms a light-transmissive member has been utilized as a method of forming a light-transmissive member that covers a light emitting element in a light emitting device. To prevent or alleviate lateral spread of the light-transmissive member in those light emitting devices, a concave or convex dam is disposed (See Japanese Patent Publication No. 2013-008941 and Japanese Patent Publication No. 2013-207230, for example).

SUMMARY

However, light emitting devices are required to have a further improved light collecting property.

The present disclosure has been made in view of such circumstances, and an object of the present disclosure is to provide a method of manufacturing a light emitting device and a light emitting device, with which the light collecting property can be improved.

A method of manufacturing a light emitting device according to the present disclosure includes: providing a wiring substrate on which a light emitting element and a frame body surrounding the light emitting element are disposed; forming a support column member in contact with at least one of an inner peripheral surface and a top surface of a corresponding portion of the frame body, an outermost edge of the support column member being positioned at a same position or inwardly of an outermost edge of the frame body in a top plan view; and forming a light-transmissive member at least partially in contact with the frame body and the support column member with at least a part of the light-transmissive member being positioned above the frame body and the support column member.

A light emitting device according to the present disclosure includes a wiring substrate, a light emitting element, a support column member and a light-transmissive member. The wiring substrate includes a frame body. The light emitting element is disposed on the wiring substrate and surrounded by the frame body in the top view. The support column member is in contact with at least one of an inner peripheral surface and a top surface of a corresponding portion of the frame body. An outermost edge of the support column member being positioned at a same position or inwardly of an outermost edge of the frame body in a top plan view. The light-transmissive member is at least partially in contact with the frame body and the support column member with at least a part of the light-transmissive member being positioned above the frame body and the support column member.

The present disclosure can provide a method of manufacturing a light emitting device and a light emitting device, with which the light collecting property can be improved.

DETAILED DESCRIPTION OF EMBODIMENTS

Figure 1A:
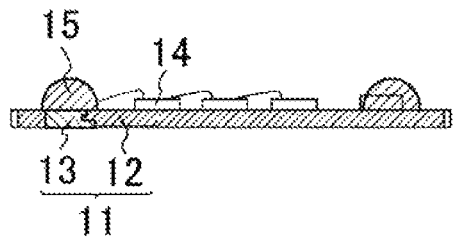
FIGS. 1A to 1G are schematic sectional process diagrams (corresponding to a cross-section taken along line I'-I" in FIG. 2B) for illustrating a method of manufacturing a light emitting device according to the present disclosure.

Hereinafter, embodiments of the present disclosure will be described with reference to the drawings as appropriate. However, a light emitting device described below is intended to embody the technical idea of the present disclosure, and the present disclosure is not limited to the following embodiments unless otherwise specified. In addition, the matters described in one embodiment or example are applicable to other embodiments or examples.

The size, the positional relation and the like of the members shown in the drawings may be exaggerated for clarification of explanation.

First Embodiment

A method of manufacturing a light emitting device according to this embodiment is performed by following manner. A wiring substrate is provided with at least one light emitting element and a frame body having a corner portion are disposed thereon while the frame body surrounds the light emitting element. A support column member is formed in contact with a surface inside of the corner portion on an inner periphery of the frame body or a top of the corner portion of the frame body in a top view. A first light-transmissive member is formed so as to be at least partially in contact with the frame body and the support column member while being positioned above an upper surface of the frame body and an upper surface of the support column member.

By forming the support column member at a predetermined position before formation of the first light-transmissive member as described above, the support column member can be made to function as a framework of the first light-transmissive member, and accordingly, the shape of the first light-transmissive member is stabilized, so that a lens-shaped member having a larger height can be easily and reliably formed. As a result, the light collecting property can be improved.

Providing Wiring Substrate and Other Member

First, a wiring substrate 11 on which a light emitting element is to be disposed is provided.

Wiring Substrate 11

The wiring substrate 11 is, for example, a base member 13 integrated with wiring 12 as shown in FIG. 1A and the like.

As the wiring 12, a lead frame may be used. In addition, wiring may be formed on the upper surface of the base member, and an electrically conductive layer serving as a terminal electrode electrically connected by, for example, a via in the substrate or wiring extended to a lateral surface of the base member may be formed on the lower surface of the wiring substrate.

Base Member 13

The base member 13 can be formed of, for example, an insulating material such as a glass epoxy, a resin or a ceramic (HTCC or LTCC), a composite material of an insulating material and a metal member, or the like. The wiring substrate 11 is preferably a wiring substrate using a ceramic or thermosetting resin which is less likely to degrade, and has high heat resistance and weather resistance. Examples of the ceramic material include alumina, mullite, forsterite, aluminum nitride (AlN), silicon carbide (SiC) and low-temperature co-fired ceramics (LTCC). In particular, use of a member having a high heat dissipation property, for example, a member having a thermal conductivity of 160 W/m·K or more is preferable, and a member formed of aluminum nitride is more preferable. The base member can be a substrate formed by composition of a ceramic material with, for example, an insulating material such as a BT resin, a glass epoxy or an epoxy-based resin may be used. In order to enhance the reflectivity of the base member itself, a porous material may be used in which particles of inorganic materials such as alumina, yttria, zirconia, titania, diamond, calcium oxide and barium sulfate are integrated together at one part, respectively, so that the porous material has a large number of openings. Accordingly, the reflectivity can be improved by a difference in refractive index between air and the materials. For example, the reflectivity at a wavelength of 450 nm is preferably at least 80%, more preferably at least 85%.

Examples of the thermosetting resin include epoxy resins, triazine derivative epoxy resins, modified epoxy resins, silicone resins, modified silicone resins, acrylate resins and urethane resins. In particular, use of a triazine derivative epoxy resin is more preferable.

The thickness of the base member 13 is, for example, in a range of 100 μm to 300 mm.

As the wiring substrate 11, a wiring substrate may be used in which a frame body 15 formed of a material the same as or similar to that of the base member 13 is formed integrally on the base member 13. The wiring substrate 11 formed integrally with the frame body 15 can be formed by, for example, a known method such as injection molding or firing of ceramic.

In one embodiment shown in FIGS. 1A to 1G, the wiring substrate 11 is plate like, and has a substantially quadrangular shape in a top view, but the planar shape of the wiring substrate 11 may be a shape appropriately determined such as a square or a polygon.

Wiring 12

The wiring 12 can be formed on the substrate by using a metal or alloy layer mainly composed of W, Mo, Ti, Ni, Au, Cu, Al, Au, Ag, Pd, Rh, Pt, SnFe or the like. Specifically, the wiring 12 may be formed by a vapor deposition method, a sputtering method, a printing method or the like, and further processing such as plating may be performed thereon. Preferably, a metal mainly containing Au is disposed on an outermost surface from the viewpoint of degradation alleviation, and adhesion with a bonding member. In addition, the wiring may be formed using Cu having a high thermal conductivity with greater thickness than other metal films for improving the heat dissipation. For example, it is preferable to use a layer containing Cu in a thickness of 25 μm or more.

The thickness of the wiring is, for example, in a range of 5 μm to 80 μm.

For example, the base member 13 of the wiring substrate 11 can be formed by injecting resin to-be the base member 11 by injection molding or the like using upper and lower molds sandwiching a lead frame as the wiring 12. The wiring substrate 11 can be formed by forming a metallized layer mainly containing a high-melting-point metal on a surface of the base member 13, and firing the whole body by a co-firing method. The wiring substrate 11 may be formed by a post-firing method in which an electrically conductive paste is applied on the sintered base member, or a metal film is stacked on the sintered base member by sputtering. Alternatively, the wiring substrate 11 may be formed by forming a metal layer on a surface of the base member, and thereafter forming a pattern by a dry film resist, etching and so on. In addition, the wiring substrate may be formed by attaching a metal plate to a prepreg of semi-cured resin, thermally curing the prepreg, and thereafter patterning the metal plate into a desired shape by a photolithography method or the like.

In formation of the wiring, a positioning mark, a polarity indicating mark, a temperature measuring pattern and so on may also be formed at the same time.

Figure 2A:
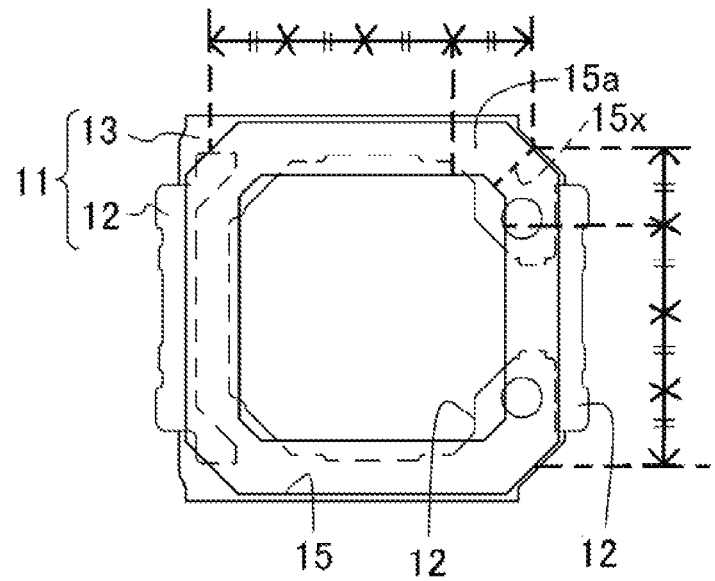
FIGS. 2A and 2B are schematic plan process diagrams for illustrating the method of manufacturing a light emitting device according to the present disclosure.
Figure 2B:
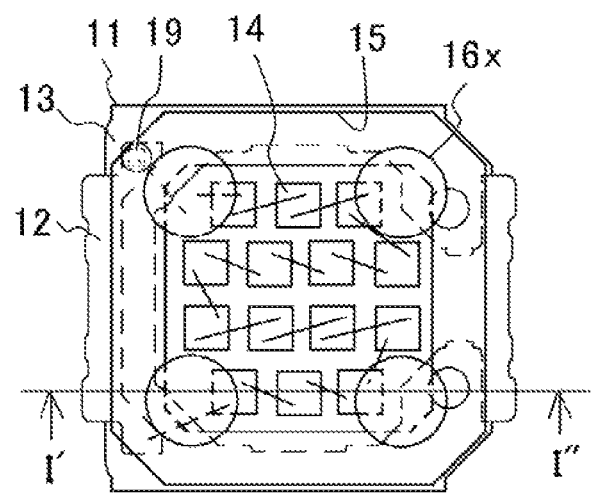

As shown in FIGS. 1A and 2B, the light emitting elements 14 are disposed, and the frame body 15 is formed on the wiring substrate 11. There is no requirement for the order of disposing of the light emitting elements 14 and formation of the frame body 15. As described above, the wiring substrate 11 may be provided using a base member integrated with the frame body 15.

Light Emitting Element 14

As the light emitting element 14, for example, a semiconductor light emitting element such as a light emitting diode chip can be used. The light emitting element includes a semiconductor layered body and a pair of electrodes.

Semiconductor Layered Body

The semiconductor layered body includes a plurality of semiconductor layers such as, for example, an n-type semiconductor layer, a light emitting layer (i.e., active layer) and a p-type semiconductor layer. The semiconductor layer can be formed of, for example, a semiconductor material such as a Group III-V compound semiconductor or a Group II-VI compound semiconductor. Specific examples of the semiconductor material include nitride-based semiconductor materials of $In_XAl_YGa_{1-X-Y}N$ ($0 \le X$, $0 \le Y$, $X+Y \le 1$) and the like.

The thickness of the semiconductor layered body may be the thickness of a layer that is used in the art.

The semiconductor layered body may be one formed on a light-transmissive substrate, or one has no such light-transmissive substrate. Examples of commonly used light-transmissive substrate includes a substrate composed of a light-transmissive insulating material such as sapphire ($Al_2O_3$) or a semiconductor material which transmits light emitted from a semiconductor layered body (e.g. nitride-based semiconductor material).

Electrode

A pair of electrodes may be respectively formed on different surface sides of the semiconductor layered body, but it is preferable that a pair of electrodes is formed on the same surface side. The electrode can be formed of a single-layer film or multi-layer film of, for example, Au, Pt, Pd, Rh, Ni, W, Mo, Cr, Ti or the like or an alloy thereof. Specifically, the multi-layer film may be obtained by stacking, for example, Ti/Rh/Au, W/Pt/Au, Rh/Pt/Au, W/Pt/Au, Ni/Pt/Au, or Ti/Rh, in this order from the semiconductor layer side. The thickness used in the art may be employed for the layer of the electrodes.

The light emitting element 14 may include a reinforcement layer disposed on a surface side of the semiconductor layered body on which the electrode is disposed. The reinforcement layer here may be formed of any of insulator, semiconductor and electrical conductive materials as long as it is capable of reinforcing the strength of the semiconductor layered body. The reinforcement layer may be either a single-layer or multi-layer. In addition, some of the reinforcement layers may be layers which secure insulation capacity, electrical conductivity and the like essential to the function of the light emitting element. In particular, some of films for forming the light emitting element may be thickened. Specifically, electrically conductive layers functioning as electrodes or the like may be thickened by a known method such as a plating or sputtering method. Interlayer insulating films, surface protective films and the like disposed between the films for forming the light emitting element may be thickened. This can prevent or alleviate size increase of the light emitting device while securing adequate strength without providing additional layer(s).

The light emitting element 14 preferably emits ultraviolet light or visible light. When the light emitting element is used in a light emitting device which emits white light, the light emitting element is preferably a light emitting element with a light emission wavelength in a range of 400 nm to 530 nm, more preferably a blue light emitting element with a wavelength in a range of 420 nm to 490 nm. A white light emitting device can be obtained by using a blue light emitting element in combination with a yellow fluorescent material as a wavelength conversion member as described later. The blue light emitting element is especially preferably a nitride-based semiconductor element ($In_xAl_yGa_{1-x-y}N$, $0 \leq x$, $0 \leq y$, $x+y \leq 1$) capable of efficiently exciting a fluorescent material.

The light emitting element 14 is disposed on the wiring 12 of the wiring substrate 11 with a bonding member interposed therebetween. Examples of the bonding member include bump, solder, electrically conductive pastes and anisotropic electrically conductive pastes. The light emitting element 14 may be connected by a wire or flip-chip-mounted on the wiring substrate 11.

On the wiring substrate 11, only one light emitting element 14 may be disposed, but is preferably disposed two or more light emitting elements 14. Arrangement of light emitting elements 14 can be appropriately determined according to the size of a light emitting element to be used, and the specifications of a light emitting device to be ultimately obtained. For example, light emitting elements can be arranged in a grid shape so that the upper surfaces of a plurality of light emitting elements form one light emitting region.

In addition, a protective element 19 or the like may be disposed in addition to the light emitting element.

Frame Body 15

The frame body 15 has corner portions 15a as shown in FIGS. 1A and 2A. The corner portion 15a commonly refers to a geometrical figure defined by two straight lines or two flat surfaces, but in the present application, the corner portion encompasses ones defined by not only straight lines and flat surfaces, but also a connection portion defined by two curved lines, two curved surfaces or the like. For example, the corner portion 15a is a connection region occupying about ¼ of the length of the two connected lines or two connected surfaces (see 15a in FIG. 2A). The connection point or connection line of the two connected lines or two connected surfaces in this case is referred to as a corner in the present application (see 15x in FIG. 2A).

The frame body 15 can be formed by, for example, discharging a resin in an annular shape onto the wiring substrate 11 using a resin discharge apparatus. Alternatively, the frame body 15 can be formed by molding a frame body by using a mold or the like in advance, and transferring or bonding the frame body onto the wiring substrate 11. Further, the frame body 15 can be formed by a resin printing method, ink jetting, a 3D printer or the like. The frame body 15 may be formed together with a wiring substrate by transfer molding, compression molding or the like.

Preferably, the frame body 15 is formed along the at least one light emitting element 14 so as to surround the light emitting element 14 while the frame body 15 is separated from the light emitting element 14. For example, the frame body 15 may be separated from the light emitting element 14 by about 100 µm. In other words, the frame body 15 is separated from the light emitting element 14 preferably by a distance equal to or less than the length of one side of the light emitting element 14, more preferably by a distance equal to or less than ½ of the length of one side of the light emitting element 14. When the frame body 15 is formed before the light emitting element 14 is disposed, it is preferable that the frame body 15 is formed about 100 µm outside a region in which the light emitting element 14 is to be disposed. Preferably, the frame body 15 is formed in a quadrangular annular shape in which the four corners each have the rounded corner portion 15a in a top view.

The frame body 15 can be formed of a ceramic, a metal, a resin or the like. As such a material, the same material as exemplified for the above-described base member can be used. In particular, it is preferable that a material for forming the frame body (i.e., base material) contains a light reflecting material so that light emitted from the light emitting element 14 to the lateral side is reflected upward by the inner wall surface of the frame body 15 to improve the light emission efficiency of the light emitting device. The light reflecting material refers a member having a reflectivity of 60% or more to light having a peak wavelength of the light emitting element. Examples of the light reflecting material include titanium oxide, silicon dioxide, zirconium dioxide, potassium titanate, alumina, aluminum nitride, boron nitride and mullite. These materials may have a shape, for example, a granular shape, a fibrous shape or a thin plate piece shape. In particular, a material having a fibrous shape are preferable because the thermal expansion coefficient of the light reflecting member can be reduced, to thereby decrease, for example, a thermal expansion coefficient difference between the light reflecting member and the light emitting element. A filler or the like may be used in addition to the light reflecting material. The filler may be one normally used in the art can be used.

In particular, applicable materials for the frame body 15 are preferably ones which can be molded in the form of a liquid or a paste, and cured as such a shape of the liquid or paste molding on the wiring substrate 11. For forming the frame body 15 with an adequate height, for example, a paste-like material having a viscosity in a range of 380 to 450 Pa·s at 25° C. is preferable.

Specific examples of the material (i.e., base material) include thermosetting resins and thermoplastic resins, and phenol resins, epoxy resins, BT resins, PPA, silicone resins and the like are preferable. In addition, powder of a light reflecting material (e.g., $TiO_2$, $Al_2O_3$, $ZrO_2$, MgO or ZnO)

having a large refractive index difference with respect to the thermosetting resin and/or thermoplastic resin is dispersed in the base material before forming the frame body, in order to improve the reflectivity of the frame body.

The height of the frame body 15 from the wiring substrate is appropriately set, but is preferably higher than the upper surface of the light emitting element 14 as shown in FIG. 1A. In addition, the width of (wall thickness) of the frame body 15 in a top view is appropriately set.

When a non-light-emitting device such as the protective element 19 is disposed on the wiring substrate 11, such a device is preferably embedded in the frame body 15 because the device causes light absorption.

Formation of Support Column Member

Figure 1B:
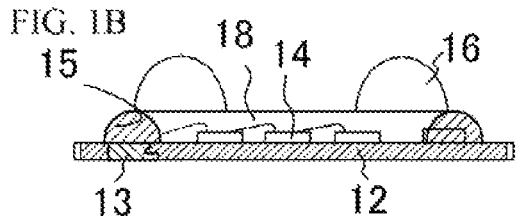
Figure 1D:
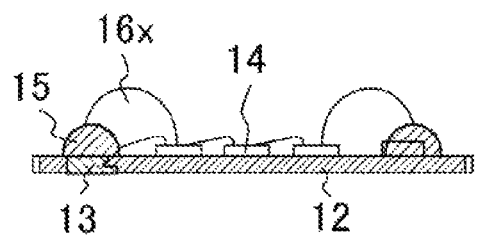
Figure 1E:
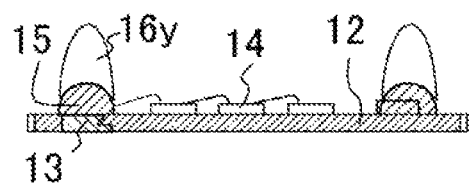
Figure 1F:
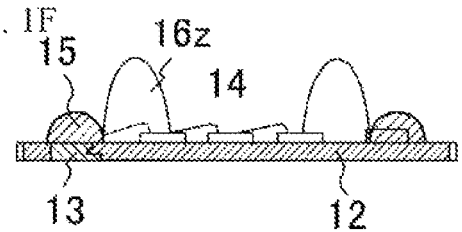

As shown in FIG. 1B or 1D and FIG. 2B, support column members 16 or 16x are respectively formed on the top of the corner portions 15a of the frame body 15 to approach inward of the frame body 15 in a top view. Alternatively, support column members 16y may be formed only on the corner portions 15a of the frame body 15 as shown in FIG. 1E, or support column members 16z may be formed only inward of the corner portions 15a of the frame body 15 as shown in FIG. 1F. When the support column member is disposed inward of the corner portion 15a, preferably the support column member is in contact with the corner portion 15a. In particular, more preferably the support column member covers the corner 15x.

Preferably, each of the support column members 16, 16x, 16y and 16z is disposed with a height greater than that of the frame body 15 in each of FIGS. 1B, 1D, 1E and 1F. The height of the support column members can be appropriately set according to the height of the frame body 15, the material of a first light-transmissive member as described later, and so on.

The shape of each of the support column members 16, 16x, 16y and 16z in top view can be appropriately set according to a material to be used, and a formation method. The support column members can be formed by, for example, a resin printing method, a method using ink jet, a method using a 3D printer or the like, potting or the like. The shape of the support column member 16 in a top view is preferably a substantially circular shape as shown in, for example, FIG. 2B. The region occupied by each of the support column members 16, 16x, 16y and 16z in this case has a diameter in a range of about 100 µm to 5000 µm. Each of the support column members 16, 16x, 16y and 16z preferably has a tapered shape, in other words, a shape which becomes thinner as approaching toward the tip.

Preferably, the support column members 16, 16x, 16y and 16z are formed of a light-transmissive material. Examples of the light-transmissive material include the above-described resins. In particular, the support column member is formed of the same material as that of the later-described first light-transmissive member. The support column member is preferably formed of a material having a refractive index lower than that of the first light-transmissive member. For adjusting the refractive index, a fluorine-based polymer can be used as a resin. Further, a filler, a light scattering material or the like which is known in the art may be used. Adding a material such as a filler or a light scattering material in the support column member can improve the reflectivity of the support column member. Accordingly, light from the light emitting element is easily reflected upward by the support column member, and therefore the light collection of the light emitting device is easily improved.

Disposition of the support column member 16, 16x, 16y or 16z can alleviate lateral spread of the first light-transmissive member, so that a lens-shaped first light-transmissive member having a large height can be stably formed irrespective of the material of the later-described first light-transmissive member.

Formation of First Light-Transmissive Member

Figure 1C:
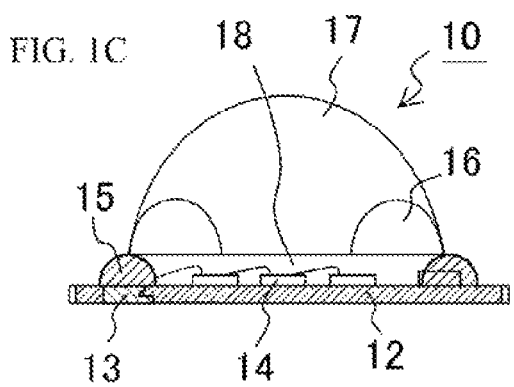
Figure 1G:
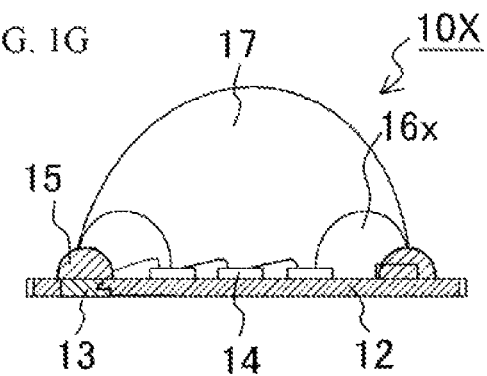

As shown in FIG. 1C or 1G, a first light-transmissive member 17 covering the light emitting element is formed. The first light-transmissive member 17 is formed in such a manner that at least a part of the first light-transmissive member 17 is in contact with the frame body 15 and the support column member 16, 16x, 16y or 16z, and is positioned higher than the upper surfaces of the frame body 15 and the support column member 16, 16x, 16y or 16z. For example, the first light-transmissive member 17 is preferably formed in such a manner that the first light-transmissive member 17 comes into contact with the support column member 16, 16x, 16y or 16z at the time when the preliminarily disposed support column member is semi-cured. This can alleviate formation of an interface between the support column member and the first light-transmissive member in the case where, for example, the same light-transmissive resin material is used for the support column member and the first light-transmissive member. Accordingly, the light extraction efficiency of the light emitting device is improved. The first light-transmissive member may be formed in such a manner that the first light-transmissive member comes into contact with the support column member 16, 16x, 16y or 16z after the support member is substantially fully cured. Semi-curing or substantially fully curing the support column member can maintain the support column member in a desired shape.

The first light-transmissive member may be formed so as to cover at least a part of the support column member, or may be formed so as to cover the entire support column member therein. Forming the first light-transmissive member covering the entire support column member can prevent exposure of the support column member from the first light-transmissive member, and therefore the shape of the first light-transmissive member is easily controlled. This can easily control the light distribution of the light emitting device.

Forming the first light-transmissive member 17 after forming the support column member can realize the first light-transmissive member 17 including a hemispherical lens and having greater height. This can improve the light collection of the light emitting device.

The first light-transmissive member 17 can be formed by, for example, potting a base material for forming the first light-transmissive member 17 in the frame body 15.

The first light-transmissive member 17 can be formed of the above-described light-transmissive resin material, which is used for encapsulating a general light emitting device with a light emitting diode or the like disposed therein. Specific examples of the light-transmissive resin material include silicone resins, epoxy resins and urea resins. In particular, it is preferable that the light-transmissive resin for forming the first light-transmissive member 17 is formed of the same material as the light-transmissive resin for forming the support column member 16. This can improve bonding strength between the first light-transmissive member and the support column member. In this specification, the same material means the same kind of materials. For example, the light-transmissive resin for forming the first light-transmissive member 17 and the light-transmissive resin for forming the support column member 16 are formed of dimethyl silicone, the light-transmissive resin for forming the first light-transmissive member 17 and the light-transmissive resin for forming the support column member 16 are formed of the same material.

The refractive index of the first light-transmissive member 17 may be higher than the refractive index of the material for forming the support column member 16. The first light-transmissive member 17 having a high refractive index can reduce the refractive index difference between the first light-transmissive member and the light-transmissive substrate of the light emitting element decreases, so that light is easily extracted from the light emitting element. The first light-transmissive member 17 may contain a filler, a light scattering material or the like which is known in the art. The first light-transmissive resin can be formed of a slurry-like resin material having a relatively low viscosity (e.g., viscosity in a range of 0.01 to 5.0 Pa·s at 25° C.) because the previously formed frame body 15 and/or support column member 16, 16x, 16y or 16z serves as a dam, and also serves as a framework for raising the first light-transmissive resin.

Formation of Second Light-Transmissive Member

Before or after formation of the support column member or before formation of the first light-transmissive member 17, a second light-transmissive member 18 covering the light emitting element 14 may be formed as shown in FIG. 1B. Preferably, the second light-transmissive member 18 is formed using the above-described light-transmissive material containing a wavelength conversion substance.

In particular, it is preferable that after formation of the frame body 15 and before formation of the support column member 16, the second light-transmissive member 18 is formed inward of the frame body 15 while having a height equivalent to or slightly greater or less than the height of the frame body 15 as shown in FIG. 1B.

Wavelength Conversion Substance

The wavelength conversion substance may be one that can be excited by at least light, which is emitted from the light emitting element, to emit light having a different wavelength. Examples of the wavelength conversion substance include oxide-based fluorescent materials, sulfide-based fluorescent materials and nitride-based fluorescent materials. For example, when a gallium nitride-based light emitting element which emits blue light is used as the light emitting element, employed fluorescent materials can be, for example, YAG-based fluorescent materials and LAG-based fluorescent materials that absorb blue light to emit yellow or green light; SiAlON-based (e.g., β-SiAlON) fluorescent materials that emit green light; SCASN, CASN-based and KSF-based fluorescent materials (e.g., $K_2SiF_6$:Mn) that emit red light, and sulfide-based fluorescent materials, or a combination thereof. The particle size of the wavelength conversion substance is, for example, in a range of about 2 μm to 50 μm, preferably 5 μm to 20 μm. As the particle size of the wavelength conversion substance increases, the light extraction efficiency of the light emitting device tends to be improved, but color non-uniformity tends to increase.

In addition, the second light-transmissive member may contain a filler or a light scattering material, such as barium sulfate, titanium oxide, aluminum oxide, silicon oxide.

Second Embodiment

As shown in FIG. 1C, a light emitting device 10 according to this embodiment has the following structures. A light emitting element 14 is disposed on the wiring substrate 11. A frame body 15 having a corner portion 15a is disposed on the wiring substrate 11 while surrounding the light emitting element 14. A support column member 16 is in contact with a surface inside of the corner portion 15a on an inner periphery of the frame body 15 or a top of the corner portion 15a of the frame body 15 in a top view. The first light-transmissive member 17 is at least partially in contact with the frame body 15 and the support column member 16 while being positioned above an upper surface of the frame body 15 and an upper surface of the support column member 16.

The support column member 16 may be disposed only on the corner portion 15a of the frame body 15 as shown in FIG. 1E, or may be disposed only inward of the corner portion 15a of the frame body 15 as shown in FIG. 1F.

Specifically, the light emitting device 10 in FIGS. 1C and 2B includes fourteen light emitting elements 14 on the wiring substrate 11 which is formed of polyphthalamide. The wiring substrate 11 includes wiring 12 in which a copper plate is plated with Ag. The frame body 15 is disposed so as to surround the outer periphery of the light emitting elements 14 with a rounded quadrangular shape having an outer peripheral size of about 6.5 mm×about 5.8 mm. The frame body 15 has a width of about 720 μm in a top view, and a height of about 510 μm from the wiring. For the frame body 15, phenyl silicone containing titanium oxide is used. The frame body 15 is formed of dimethyl silicone containing fluorescent materials of YAG ($Y_3Al_5O_{12}$:Ce), LAG ($Lu_3Al_5O_{12}$:Ce) and SCASN ((Sr, Ca)$AlSiN_3$:Eu). A second light-transmissive member 18 is formed with a height of about 380 μm from the wiring. The support column member 16 having a diameter of about 1 mm and a height in a range of about 300 μm to 400 μm is disposed inward of the top of the corner portion 15a of the frame body 15. For the resin for forming the support column member 16, dimethyl silicone is used. The first light-transmissive member 17 is disposed above the upper surfaces of the frame body 15 and the support column member 16 while being in contact with the frame body 15, the second light-transmissive member 18 and the support column member 16. The first light-transmissive member 17, for which dimethyl silicone is used, has a height of about 1320 μm from the upper surface of the second light-transmissive member 18.

For comparison, a light emitting device X was manufactured, where the support column member 16 in the light emitting device 10 was absent. In this case, the first light-transmissive member 17 had a height of about 920 μm from the upper surface of the second light-transmissive member 18.

Figure 3:
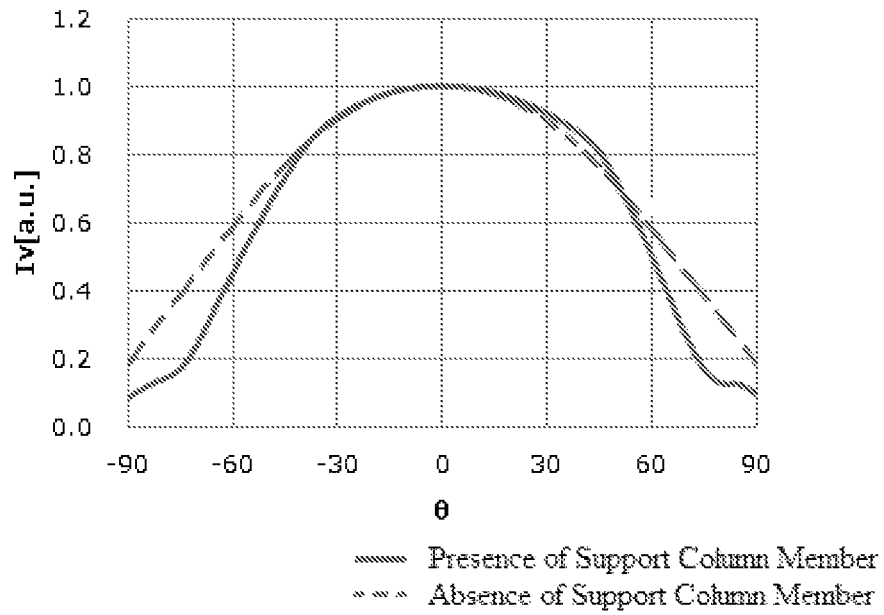
FIG. 3 is a graph showing the directivity of a light emitting device according to the present disclosure.

Using the light emitting device 10 and the light emitting device X for comparison, the directivity property was measured. The result showed that the light emitting device 10 of the second embodiment, which included a support column member, had a light distribution property of collecting light on an upper side (i.e., the front of the light emitting surface) as shown in FIG. 3. In FIG. 3, the center of the horizontal axis represents luminous intensity in a normal line direction (at 0 degree) with respect to the light extraction surface of the light emitting device. The value at the right end represents a luminous intensity at 90 degrees (i.e., horizontal direction). The value at the left end represents the luminous intensity at −90 degrees (i.e., horizontal direction).

Third Embodiment

A method of manufacturing a light emitting device according to a third embodiment is performed by following manner. A wiring substrate on which a frame body having a corner portion is disposed is provided, and thereafter a light emitting element is disposed on the wiring substrate with the frame body surrounding the light emitting element. A support column member is formed so as to be in contact with a surface inside of the corner portion on an inner periphery of the frame body or a top of the corner portion of the frame body in a top view. The first light-transmissive member is formed so as to be at least partially in contact with the frame body and the support column member while being positioned above an upper surface of the frame body and an upper surface of the support column member.

Figure 4:
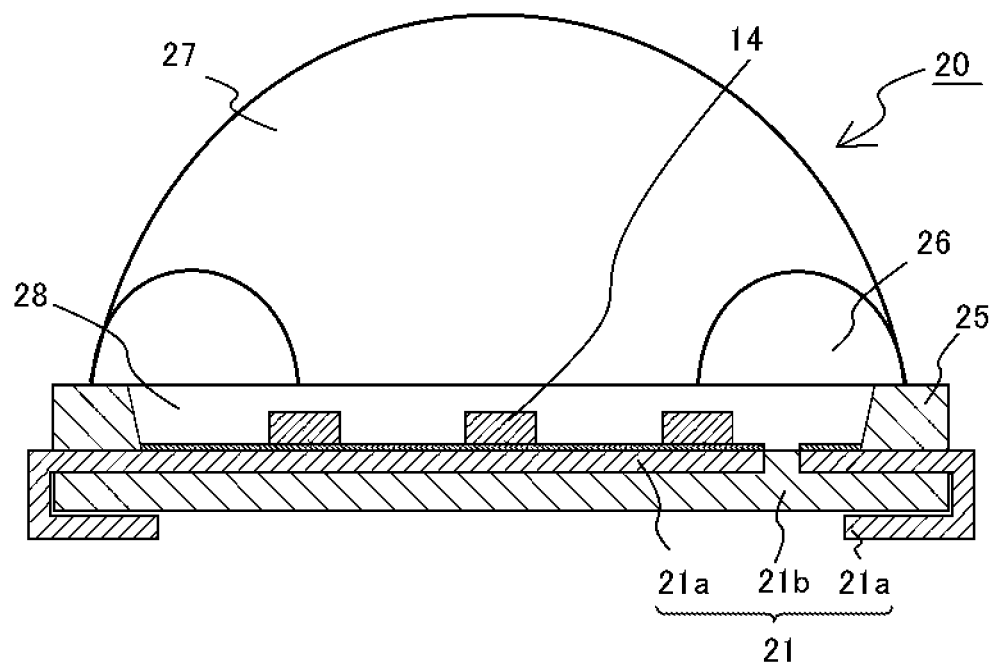
FIG. 4 is a schematic sectional view of a light emitting device for illustrating the method of manufacturing a light emitting device according to the present disclosure.

As shown in, for example, FIG. 4, The manufacturing method according to this embodiment is substantially the same as in the first embodiment except that here, a wiring substrate is used in which a resin package 21b provided with a lead 21a includes a frame body 25 as a reflecting member integrally formed on the upper surface of the lead 21a.

The method of manufacturing a light emitting device according to the third embodiment exhibits the same effect as in the method of manufacturing a light emitting device according to the first embodiment.

Fourth Embodiment

As shown in FIG. 4, a light emitting device 20 according to the fourth embodiment has a following structure. A wiring substrate in which a resin package 21b provided with a lead 21a is integrally formed with a frame body 25 serving as a reflecting member on the upper surface thereof. A light emitting element 14 disposed on the wiring substrate. A support column member 26 formed on the top of the corner portions of the frame body to approach inward of the frame body in a top view. A first light-transmissive member 27 is formed so as to be at least partially in contact with the frame body 25 and the support column member 26 while being positioned above an upper surface of the frame body 25 and an upper surface of the support column member 26. As shown in FIG. 4, the light emitting device 20 may include a second light-transmissive member 28 positioned below the first light-transmissive member 27 while covering the light emitting element 14.

The light emitting device according to this embodiment exhibits the same effect as in the second embodiment.

The light emitting device according to the present disclosure can be used for backlight light sources for liquid crystal displays, various lighting fixtures, large displays, various display devices for advertisement, destination guide and the like, image reading devices in digital video cameras, facsimile machines, copy machines, scanners and the like, projector devices, and the like.

What is claimed is:

1. A method of manufacturing a light emitting device comprising:
    providing a wiring substrate on which a light emitting element and a frame body surrounding the light emitting element are disposed;
    after the providing of the wiring substrate on which the light emitting element and the frame body are disposed, forming a support column member in contact with at least one of an inner peripheral surface and a top surface of a corresponding portion of the frame body, an outermost edge of the support column member being positioned at a same position or inwardly of an outermost edge of the frame body in a top plan view; and
    forming a light-transmissive member at least partially in contact with the frame body and the support column member with at least a part of the light-transmissive member being positioned above the frame body and the support column member.

2. The method of manufacturing a light emitting device according to claim 1, wherein the frame body contains a light reflecting material.

3. The method of manufacturing a light emitting device according to claim 1, wherein the forming of the support column member includes forming the support column member using a light-transmissive resin.

4. The method of manufacturing a light emitting device according to claim 1, wherein the forming of the support column member includes forming the support column member in a tapered cross-sectional shape.

5. The method of manufacturing a light emitting device according to claim 1, wherein the forming of the light-transmissive member includes forming the light-transmissive member to cover at least a part of the support column member.

6. The method of manufacturing a light emitting device according to claim 1, wherein the providing of the wiring substrate includes providing a base member and forming the frame body on the base member.

7. The method of manufacturing a light emitting device according to claim 1, wherein the providing of the wiring substrate includes providing the wiring substrate integrally formed with the frame body.

8. The method of manufacturing a light emitting device according to claim 3, wherein the forming of the light-transmissive member includes forming the light-transmissive member using the same material as the light-transmissive resin for forming the support column member.

9. The method of manufacturing a light emitting device according to claim 3, wherein the forming of the light-transmissive member includes forming the light-transmissive member using a material having a refractive index different from a refractive index of the support column member.

10. The method of manufacturing a light emitting device according to claim 3, wherein the forming of the light-transmissive member includes forming the light-transmissive member using a material having a refractive index higher than a refractive index of the support column member.

11. A light emitting device comprising:
    a wiring substrate including a frame body;
    a light emitting element disposed on the wiring substrate and surrounded by the frame body in the top view;
    a support column member in contact with at least one of an inner peripheral surface and a top surface of a corresponding portion of the frame body, an outermost edge of the support column member being positioned at a same position or inwardly of an outermost edge of the frame body in a top plan view, the support column member being formed of a light-transmissive resin; and
    a light-transmissive member at least partially in contact with the frame body and the support column member with at least a part of the light-transmissive member being positioned above the frame body and the support column member.

12. The light emitting device according to claim 11, wherein the frame body contains a light reflecting material.

13. The light emitting device according to claim 11, wherein the support column member has a tapered cross-sectional shape.

14. The light emitting device according to claim 11, wherein the light-transmissive member covers at least a part of the support column member.

15. The light emitting device according to claim 11, wherein the wiring substrate includes a base member and the frame body is disposed on the base member.

16. The light emitting device according to claim 11, wherein the frame body is integrally formed with the wiring substrate.

17. The light emitting device according to claim 11, wherein the light-transmissive member is formed of the same material as the light-transmissive resin of the support column member.

18. The light emitting device according to claim 11, wherein the light-transmissive member has a refractive index different from a refractive index of the support column member.

19. The light emitting device according to claim 11, wherein the light-transmissive member has a refractive index higher than a refractive index of the support column member.

20. A light emitting device comprising:
a wiring substrate including a frame body;
a light emitting element disposed on the wiring substrate and surrounded by the frame body in the top view;
a support column member in contact with at least one of an inner peripheral surface and a top surface of a corresponding portion of the frame body, an outermost edge of the support column member being positioned at a same position or inwardly of an outermost edge of the frame body in a top plan view, the support column member and the frame body being made of materials with different compositions; and
a light-transmissive member at least partially in contact with the frame body and the support column member with at least a part of the light-transmissive member being positioned above the frame body and the support column member.

* * * * *